United States Patent
Balakrishnan et al.

(10) Patent No.: US 10,388,648 B2
(45) Date of Patent: Aug. 20, 2019

(54) VERTICAL FIELD EFFECT TRANSISTOR (VFET) PROGRAMMABLE COMPLEMENTARY METAL OXIDE SEMICONDUCTOR INVERTER

(71) Applicant: INTERNATIONAL BUSINESS MACHINES CORPORATION, Armonk, NY (US)

(72) Inventors: Karthik Balakrishnan, White Plains, NY (US); Pouya Hashemi, White Plains, NY (US); Tak H. Ning, Yorktown Heights, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/298,458

(22) Filed: Mar. 11, 2019

(65) Prior Publication Data
US 2019/0206859 A1    Jul. 4, 2019

Related U.S. Application Data

(63) Continuation of application No. 15/819,398, filed on Nov. 21, 2017.

(51) Int. Cl.
*H01L 29/66* (2006.01)
*H01L 27/06* (2006.01)
(Continued)

(52) U.S. Cl.
CPC .... *H01L 27/0617* (2013.01); *H01L 21/82385* (2013.01); *H01L 21/823857* (2013.01);
(Continued)

(58) Field of Classification Search
CPC ........... H01L 27/0617; H01L 21/82385; H01L 21/823857; H01L 21/823871;
(Continued)

(56) References Cited

U.S. PATENT DOCUMENTS 8,705,280 B2    4/2014 Cai et al.

OTHER PUBLICATIONS

List of IBM Patents or Patent Applications Treated as Related dated Mar. 11, 2019, 2 pages.

*Primary Examiner* — Calvin Y Choi
(74) *Attorney, Agent, or Firm* — Tutunjian & Bitetto, P.C.; Erik Johnson

(57) ABSTRACT

A method of forming a semiconductor inverter that includes forming a first conductivity type vertically orientated semiconductor device in a first region of a substrate, and a second conductivity type vertically orientated semiconductor device in a second region of the substrate. A common contact is formed electrically connecting an upper source and drain region for the first conductivity type vertically orientated semiconductor device to an upper source and drain region of the second conductivity type vertically orientated semiconductor device. The common electrical contact providing an output for the inverter. The method may further include forming a first electrical contact to a first gate structure to a first of the first and second conductivity type vertically orientated semiconductor device to provide an input for the inverter.

20 Claims, 13 Drawing Sheets

(51) Int. Cl.
*H01L 21/8238* (2006.01)
*H01L 29/788* (2006.01)
*H01L 29/78* (2006.01)
*H01L 29/423* (2006.01)

(52) U.S. Cl.
CPC ............... *H01L 21/823871* (2013.01); *H01L 21/823885* (2013.01); *H01L 29/42364* (2013.01); *H01L 29/7827* (2013.01); *H01L 29/7889* (2013.01)

(58) Field of Classification Search
CPC ....... H01L 21/823885; H01L 29/42364; H01L 29/7827; H01L 29/7889
USPC ......................................................... 257/329
See application file for complete search history.

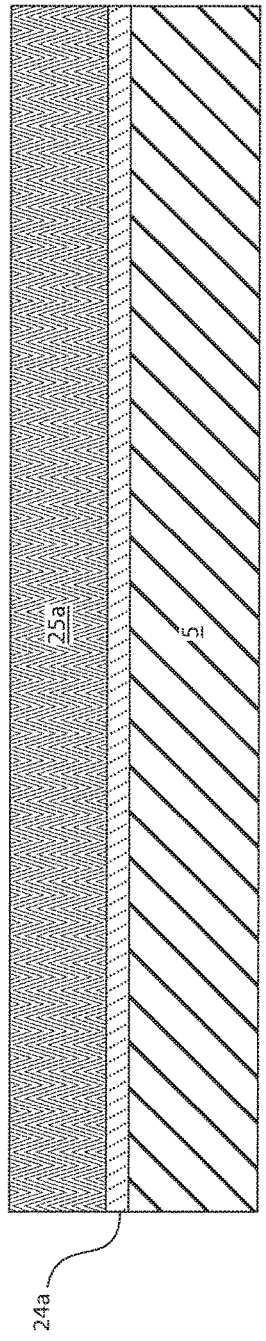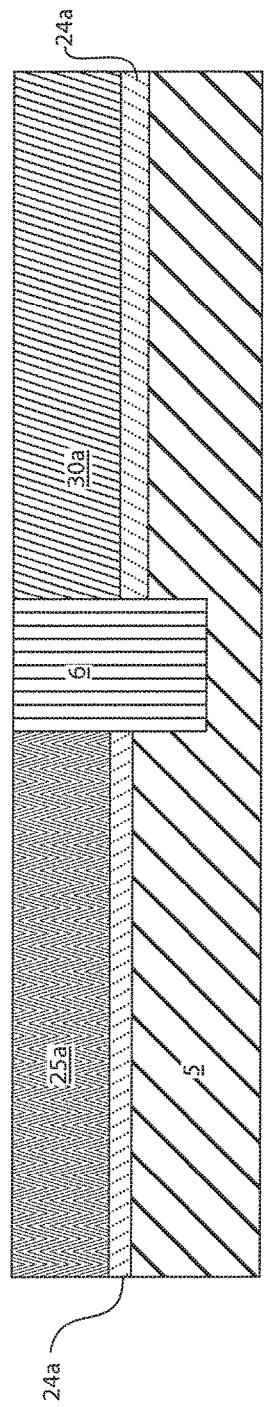

US 10,388,648 B2

1

VERTICAL FIELD EFFECT TRANSISTOR (VFET) PROGRAMMABLE COMPLEMENTARY METAL OXIDE SEMICONDUCTOR INVERTER

BACKGROUND

Technical Field

The present disclosure relates to vertical transistors and semiconductor inverters.

Description of the Related Art

Modern integrated circuits are made up of literally millions of active devices such as transistors and memory devices. The geometry of vertical transistors is attractive due to their potential density with increased scaling requirements. Further vertical transistors can allow for relaxed gate lengths to better control electrostatics. New inverter structures are desired to integrate with vertical transistors.

SUMMARY

In one embodiment, the methods and structures that are described herein provide a programmable complementary metal oxide semiconductor (CMOS) inverter that is integrated into a vertical transistor process flow.

In one aspect, a semiconductor inverter is provided that includes a first vertical semiconductor device including a first channel region present in a first fin structure having first conductivity type source and drain regions. A second vertical semiconductor device includes a second channel region present in a second fin structure having second conductivity type source and drain regions. A common contact is present electrically connecting an upper first conductivity source and drain region of the first vertical semiconductor device to an upper second conductivity source and drain region of the second vertical semiconductor device. The common contact provides an output for the inverter. A first gate structure has electrical contact with a first of the first and second vertical semiconductor device. The first gate structure provides an input for the inverter. A second gate structure has electrical contact with a second of the first and second vertical semiconductor devices. The second gate structure is a floating gate.

In another embodiment, the semiconductor inverter includes a first vertical semiconductor device having source and drain regions of a first conductivity type; and a second vertical semiconductor device having source and drain regions of a second conductivity type. A common contact electrically connects an upper source and drain region of the first conductivity type for the first vertical semiconductor device to an upper source and drain region of the second conductivity type for the second vertical semiconductor device. The common contact provides an output for the inverter. The semiconductor inverter includes a first gate structure to a first of the first and second vertical semiconductor device having electric contact with an input for the inverter. The semiconductor inverter also includes a second gate structure to a second of the first and second vertical semiconductor device. The second gate structure is a floating gate.

In another aspect, a method is provided herein for forming a semiconductor inverter using a vertical transistor process flow. In one embodiment, the method of forming a semiconductor inverter includes forming a first conductivity type vertically orientated semiconductor device in a first region of a substrate; and forming a second conductivity type vertically orientated semiconductor device in a second region of the substrate. A common contact is formed electrically connecting an upper source and drain region for the first conductivity type vertically orientated semiconductor device to an upper source and drain region of the second conductivity type vertically orientated semiconductor device. The common contact provides an output for the inverter. A first electrical contact is formed to a first gate structure to a first of the first and second conductivity type vertically orientated semiconductor device to provide an input for the inverter. A second contact is formed to a second gate structure to a second of the first and second conductivity type vertically orientated semiconductor device providing a floating gate. The floating gate is not contacted to a voltage node, but the floating gate may be connected to the floating gate of another device.

BRIEF DESCRIPTION OF DRAWINGS

The disclosure will provide details in the following description of preferred embodiments with reference to the following figures wherein:

FIG. 3 is a side cross-sectional view of an initial structure for forming the programmable complementary metal oxide semiconductor (CMOS) inverter that is depicted in FIG. 2.

FIG. 4 is a side cross-sectional view of one embodiment the structure depicted in FIG. 3 following processing to provide a first conductivity source/drain region for a first vertical semiconductor device 100a that is an n-type device, and a second conductivity type source/drain region for a second vertical semiconductor device that is a p-type device.

DETAILED DESCRIPTION OF PREFERRED EMBODIMENTS

Figure 1:
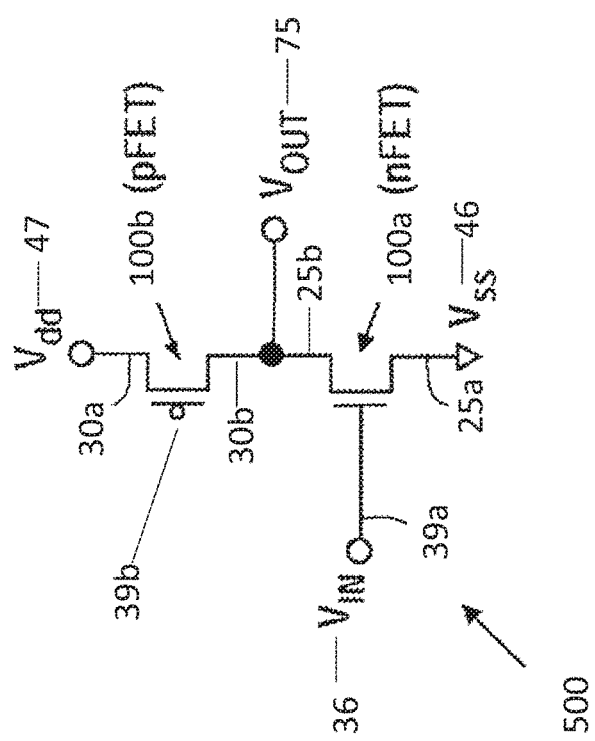
FIG. 1 is a circuit diagram of the programmable CMOS inverter that is depicted in FIG. 2.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

With increasing scaling for next generation semiconductor devices, vertical field effect transistors (vFETs) have become increasingly attractive. For example, vertical FET devices are attractive for 5 nm device architecture due to sub-30 nm fin pitch and since they are not constrained by the contact poly pitch (CPP) and gate width scaling. Vertical transistors are attractive candidates for 5 nm node and beyond due to their potential of better density scaling and allowing relaxed gate lengths to better control the electrostatics.

Figure 2:
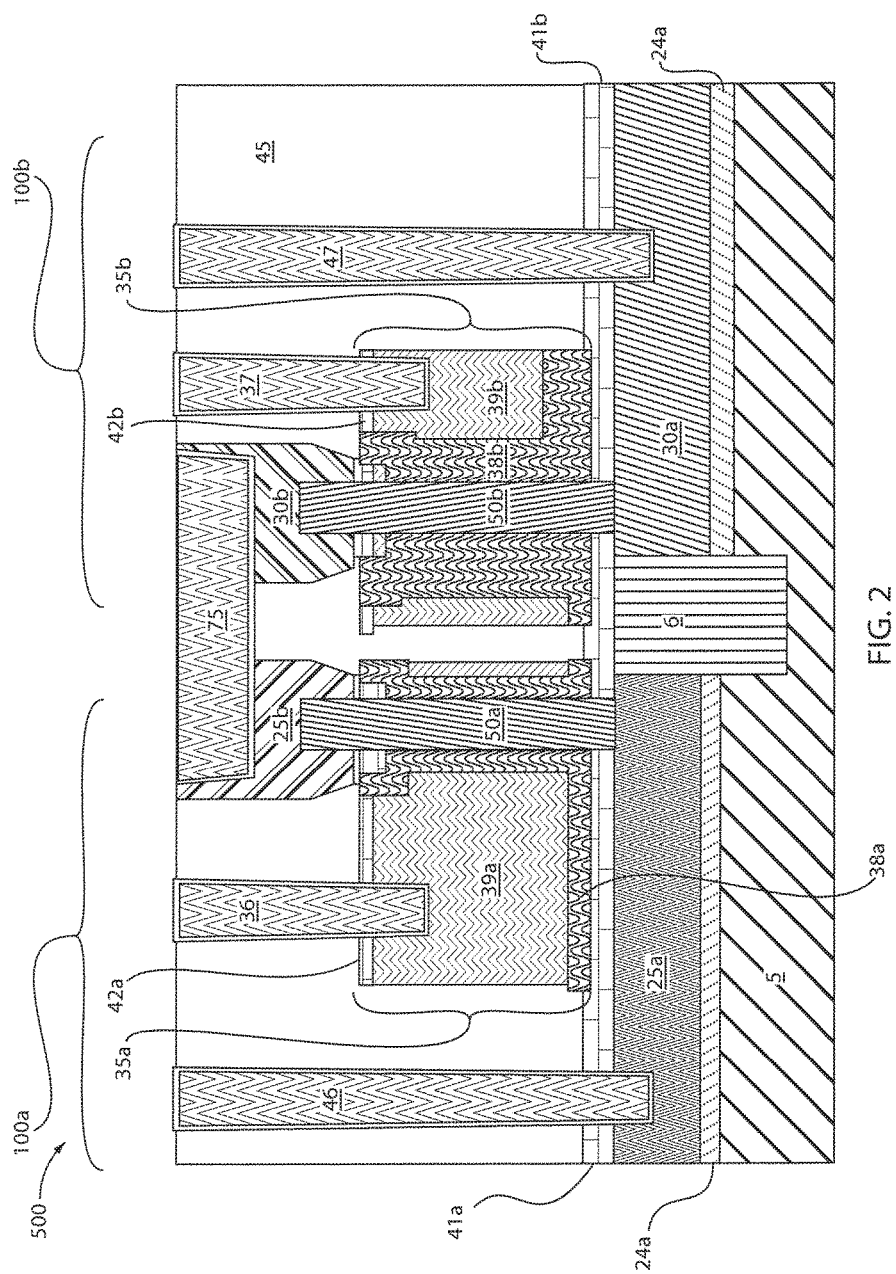
FIG. 2 is a side cross-sectional view of a programmable complementary metal oxide semiconductor (CMOS) inverter that is composed of vertical field effect transistors (VFETs), in accordance with one embodiment of the present disclosure.

Programmable complementary metal oxide semiconductor (CMOS) inventors are needed in custom chip structures. The CMOS inverter consists of the two transistor types which are processed and connected, as depicted in FIGS. 1 and 2. In some embodiments, the methods and structures described herein provide a programmable complementary metal oxide semiconductor (CMOS) inverter structure that is integrated into a vertical transistor field effect transistor (FET) process flow. Unlike a traditional layout, the n-type field effect transistor (NFET) and p-type field effect transistor (PFET) are positioned adjacent to one another, which allows for simple wiring of the input, output and power supply lines. In some embodiments, the gate structure for the p-type field effect transistor (PFET) is the programmable gate of the inverter, which can be connected to a base line for programming.

FIG. 1 is the circuit diagram of a CMOS circuit 500. The first source/drain regions 25a of the first vertical semiconductor device structure 100a connects reference potential Vss 46, i.e. ground voltage, which equals zero Volts, to the source region of the nFET 100a. The first gate electrode 39a is connected by line 36 to an input terminal VIN.

The second gate electrode 39b of the second vertical semiconductor device 100b is a floating gate.

The second source/drain regions 25b of the first vertical semiconductor device structure 100a is connected the second source/drain region 30b of the second vertical semiconductor device 100b through a common contact 75 to an output terminal VOUT.

The first source/drain region 30a of the second vertical semiconductor device 100b is connected to a power supply terminal Vdd.

The input and output voltages of the inverter 500 are related so that when VIN is in a logic state of "0" or has a value substantially equal to zero, VOUT is in a logic state of "1" or has a value substantially equal to Vdd, and when VIN is in a logic state of "1" or has a value substantially equal to Vdd, VOUT is in a logic state of "0" or has a value substantially equal to zero. These relationships are indicated in Table I below, as will be well understood by those skilled in the art.

TABLE I

| VIN | VOUT |
|---|---|
| "0" or zero | "1" or Vdd |
| "1" or Vdd | "0" or zero |

FIG. 1 and the above description provide one example of a semiconductor inverter in accordance with the methods and structures described herein.

FIG. 2 depicts one embodiment of a programmable complementary metal oxide semiconductor (CMOS) inverter that is composed of vertical field effect transistors (VFETs). As used herein a "field effect transistor" is a transistor in which output current, i.e., source-drain current, is controlled by the voltage applied to the gate. A field effect transistor has three terminals, i.e., gate, source and drain. A "gate structure" means a structure used to control output current (i.e., flow of carriers in the channel) of a semiconducting device through electrical fields. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel. Because the source region and the drain region are both provided by doped regions on opposing sides of the channel of the device, and their function as a source region or a drain region is impacted by the bias applied to these regions in the final device structure, the term source/drain region is suitable for describing the doped regions in the absence of the bias that designates their type.

The field effect transistors of the present disclosure have a vertically orientated channel region that can be present within a fin structure. As used herein, a "fin structure" refers to a semiconductor material, which is employed as the body of a semiconductor device, in which the gate structure is positioned around the fin structure such that charge flows down the channel of the fin structure A finFET is a semiconductor device that positions the channel region of the semiconductor device in a fin structure. As used herein, the term "channel" is the region adjacent to the gate structure and between the source and drain of a semiconductor device that becomes conductive when the semiconductor device is turned on. The source and drain regions of the fin structure are the portions of the fin structure that are on opposing sides of the channel region of the fin structure. A "vertical" finFET semiconductor device has the drain, fin channel, and source device components arranged perpendicular to the plane of the substrate surface, which is referred to as a vertical stack. A vertically stacked finFET can have a longer gate length (i.e., height) and larger dielectric spacer than a horizontal (i.e., having the drain, fin channel, and source device components arranged parallel with the plane of the substrate surface) finFET having comparable contact gate pitch.

Referring to FIG. 2, in some embodiments, the vertical field effect transistor (VFET) programmable complementary metal oxide semiconductor (CMOS) inverter 500 includes a first vertical semiconductor device 100a including a first channel region present in a first fin structure 50a having source/drain regions 25a, 25b of a first conductivity type; and a second vertical semiconductor device 100b including a second channel region present in a second fin structure 50b having source/drain regions 30a, 30b of a second conductivity type. The term "conductivity type" denotes whether the devices which the region have a p-type conductivity or an n-type conductivity. In the embodiment depicted in FIG. 2, the first vertical semiconductor device 100a is an n-type semiconductor device, i.e., the semiconductor device includes n-type source and drain regions 25a, 25b. In the embodiment depicted in FIG. 2, the second vertical semiconductor device 100b is a p-type semiconductor device, i.e., the semiconductor device includes p-type source and drain regions 30a, 30b. The first vertical semiconductor device 100a can be present in a first region of a supporting substrate 5, and the second vertical semiconductor device 100b is present in a second region of the supporting substrate 5. The first region of the supporting substrate 5 is separated from a second region of the supporting substrate 5 by an isolation region 6.

A common contact 75 is present in the inverter 500 that is electrically connecting an upper source and drain region 25b of the first conductivity type, e.g., n-type, for the first vertical semiconductor device 100a to an upper source and drain region 30b of the second conductivity type, i.e., p-type, for the second vertical semiconductor device 100b. In some embodiments, the upper source and drain region 25b for the first vertical semiconductor device 100a that is in electrical communication with the common contact 75 is an n-type drain region. In some embodiments, the upper source and drain region 30b for the second vertical semiconductor device 100b that is in electrical communication with the common contact 75 is a p-type drain. In some embodiments, the common contact 75 provides an output for the inverter 500.

Still referring to FIG. 2, the vertical field effect transistor (VFET) programmable complementary metal oxide semiconductor (CMOS) inverter 500 includes a first gate structure 35a to the first vertical semiconductor device 100a having electric contact with an input, i.e., having an input contact 36, for the inverter 500. The first gate structure 35a includes a first gate dielectric 38a that is in direct contact with a channel region present within the fin structure 50a of the first vertical semiconductor device 100a. A first gate conductor 39a is present in direct contact with the first gate dielectric 38a. A first spacer 41a separates the first gate structure 35a from first source and drain region of the first conductivity type 25a. A second spacer 42a separates the first gate structure 35a from the second source and drain region of the first conductivity type 25b. The input contact 36 is composed of an electrically conductive material, such as a metal, that extends through an interlevel dielectric 45 and a second spacer 41b into direct contact with the first gate conductor 39a.

In the embodiment that is depicted in FIG. 2, the first source and drain region having the first conductivity type 25a is an n-type source region. A negative supply voltage (VSS) connection 46 is in electrical communication with the first source and drain region having the first conductivity type 25a that is an n-type source region, which is the source/drain region of the first semiconductor device 100a that is not directly contacted by the common contact 75. The common contacts 75 is in direct contact with the second source and drain region having the first conductivity type 25a (also referred to as upper source and drain region 25b), which is an n-type drain region.

The first source and drain region having the first conductivity type 25a is separated from the supporting substrate 5 by a counterdoped layer 24a. The counterdoped layer 24a has a conductivity type that is opposite the conductivity type of the first source and drain region having the first conductivity type 25a. For example, if the first source and drain region having the first conductivity type 25a is doped to an n-type conductivity, the counterdoped layer 24a is doped to a p-type conductivity.

In some embodiments, a second gate structure 35b of the second vertical semiconductor device 100b provides the floating gate connection for the inverter 500. In the embodiments, in which the first vertical semiconductor device is an n-type semiconductor device, the second vertical semiconductor device 100b is a p-type semiconductor device having source and drain regions of a second conductivity type 35a, 35b that have a p-type conductivity. The floating gate connection (FG) to the p-type provides a programmable gate that provides the programmable aspect of the programmable complementary metal oxide semiconductor (CMOS) inverter 500 that is composed of vertical field effect transistors (VFETs) 100a, 100b. The second gate structure 35b includes a second gate dielectric 38b that is in direct contact with the second fin structure 50b that contains the channel region of the second vertical semiconductor device 100b. The second gate dielectric 38b has a thickness that is greater than the thickness of the first gate dielectric 38a of the first gate structure 35a of the first vertical semiconductor device 100a. The thickness of the second gate dielectric 38b is one feature of the second gate structure 35b that provides that the gate structure be the programmable gate of the programmable complementary metal oxide semiconductor (CMOS) inverter 500. In some embodiments, the thickness of the second gate dielectric 38b may range from 2 nm to 200 nm.

A second gate conductor 39b is present on the second gate dielectric 38b. The second gate conductor 39b may be composed of a metal, metal nitride or doped semiconductor. A first spacer 41b separates the second gate structure 35b from first source and drain region of the second conductivity type 30a. A second spacer 42b separates the second gate structure 35b from the second source and drain region of the second conductivity type 30b. A floating gate contact 36 composed of an electrically conductive material, such as a metal, that extends through an interlevel dielectric 45 and the second spacer 42b into direct contact with the second gate conductor 39b. The floating gate is not contacted to a voltage node, but the floating gate may be connected to the floating gate of another device.

Still referring to FIG. 2, the second vertical semiconductor device 100b includes a first source and drain region having the second conductivity type 30a that is a p-type source region. A positive supply voltage (VDD) connection 47 is in electrical communication with the first source/drain region having the second conductivity type 25b, which is the source/drain region of the second semiconductor device 100b that is not directly contacted by the common contact 75. The common contacts 75 is in direct contact with the second source/drain region having the second conductivity type 25b (also referred to as upper source and drain region 25b), which is an p-type drain region.

The first source and drain region having the second conductivity type 30a is separated from the supporting substrate 5 by a counterdoped layer 24b. The counterdoped layer 24b has a conductivity type that is opposite the conductivity type of the first source and drain region having the second conductivity type 30a. For example, if the first source and drain region having the second conductivity type 30a is doped to a p-type conductivity, the counterdoped layer 24b is doped to an n-type conductivity.

The first gate structure 35a and the second gate structure 35b are separate structures. The first fin structure 50a and the second fin structure 50b may be separated by a pitch ranging from 25 nm to 40 nm.

The programmable complementary metal oxide semiconductor (CMOS) inverter 500 that is composed of vertical field effect transistors (VFETs) 100a, 100b is formed using a vertical field effect transistor process flow that is described in more detail with reference to FIGS. 3-14.

FIG. 3 depicts one embodiment of an initial material stack used in forming programmable complementary metal oxide semiconductor (CMOS) inverter 500. In some embodiments, the initial material stack includes a supporting substrate 5, a counter doped layer 24a, and a material layer for provide a first source/drain region of a first conductivity type 25a.

The first source/drain region of the first conductivity type 25a, the counter doped layer 24a, and the supporting substrate 5 may each be composed of a semiconductor material, such as a type IV or type III-V semiconductor. Examples of type IV semiconductors that are suitable for use as the base material for the first source/drain region of the first conductivity type 25a, the counter doped layer 24a, and the supporting substrate 5 may include silicon (Si), crystalline silicon (c-Si), monocrystalline silicon, germanium, silicon germanium (SiGe), silicon doped with carbon (Si:C), silicon germanium doped with carbon (SiGe:C) and a combination thereof, and similar semiconductors, e.g., semiconductor materials including at least one element from Group IVA (i.e., Group 14) of the Periodic Table of Elements. Examples of type III-V materials can include gallium arsenic (GaAs).

Although the supporting substrate 5 is depicted as a bulk substrate, in other embodiments, the supporting substrate 5 may be a semiconductor on insulator (SOI) substrate.

The counter doped layer 24a may be formed on the upper surface of the supporting substrate 5 by ion implantation into the upper surface of the supporting substrate 5 or by epitaxial growth in combination with in situ doping or ion implantation. The counter doped layer 24a depicted in FIG. 3 is processed to provide the counter doped layer 24a for the first vertical semiconductor device 100a that is depicted in FIG. 2. Therefore, in this example, the counter doped layer 24a is doped to a p-type conductivity. The counter doped layer 24a may have a thickness ranging from 5 nm to 50 nm.

The material layer for providing the first source/drain region of the first conductivity type 25a may also be formed using ion implantation or epitaxial growth in combination with ion implantation or in situ doping. The material layer for providing the first source/drain region of the first conductivity type 25a typically provides the first source/drain region for the first vertical semiconductor device 100a that is depicted in FIG. 2. In the embodiment described with reference to FIG. 2, the first vertical semiconductor device 100a is an n-type semiconductor device. Therefore, in the embodiment depicted in FIG. 3, the first source/drain region of the first conductivity type 25a is typically doped to an n-type conductivity. The thickness for the material layer for providing the first source/drain region of the first conductivity 25a may have a thickness ranging from 10 nm to 100 nm.

FIG. 4 depicts one embodiment the structure depicted in FIG. 3 following processing to provide an n-type region for a first vertical semiconductor device 100a that is an n-type device, and a p-type region for a second vertical semiconductor device 100b that is a p-type device. An isolation region 6 is formed to isolate the region of the substrate 5 in which the first vertical semiconductor device 100a is positioned from the region of the substrate 5 in which the second vertical semiconductor device 100b is positioned. The isolation region 6 is formed by etching a trench, e.g., by reactive ion etch, through the material layers for the first counter doped layer 24a, and the material layer for the first source/drain region 25a for the first vertical semiconductor device 100a into the supporting substrate 5. The trench is then filled with a dielectric material, such as an oxide, e.g., silicon oxide ($SiO_2$), or a nitride, such as silicon nitride. The deposition process may be a chemical vapor deposition process.

Following formation of the isolation region 6, the portion of the structure in which the first vertical semiconductor device 100a is formed may be protected by forming an etch mask thereon, while the portions of the first counter doped layer 24 and the material layer for the first source/drain region of the first conductivity type 25a for the first vertical semiconductor device 100a that are exposed by the etch mask are removed, e.g., via etch process. The etch mask may be a photoresist mask that is patterned using photolithography. The etch mask may also be provided by a hard mask, e.g., a mask composed of a dielectric material layer, such as silicon nitride. The etch process or removing the exposed portions of the first counter doped layer 24a, and the material layer for the first source/drain region of the first conductivity type 25a may be removed by an etch process, such as a selective etch process. For example, the etch process for removing the exposed portions of the first counter doped layer 24a, and the material layer for the first source/drain region of the first conductivity type 25a may include an etch process that is selective to the supporting substrate 5. In some embodiments, the etch process may be an anisotropic etch process, such as reactive ion etch.

Still referring to FIG. 4, the second counter doped layer 24b, and the material layer for providing the first source/drain region of the second conductivity type 30a may be formed on the portion of the supporting substrate 5 in which the second vertical semiconductor device 100b is formed. In one embodiment, the second counter doped layer 24b is formed using epitaxial growth. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxially formed second counter doped layer 24b, and the material layer for providing the first source/drain region of the second conductivity type 30a for the second vertical semiconductor device 100b, e.g., p-type semiconductor device, can be a type IV semiconductor containing material layer. For example, the epitaxially formed in situ doped material for the second counter doped layer 24b and the first source/drain region of the second conductivity type 30a may be composed of silicon (Si), germanium (Ge), silicon germanium (SiGe) and other semiconductor materials. It is noted that these are only examples of base compositions for the second counter doped layer 24b and the first source/drain region of the second conductivity type 30a, but the second counter doped layer 24b and the first source/drain region of the second conductivity type 30a may be any semiconductor material, such as those described above for the first counter doped layer 24a and the first source/drain region of the first conductivity type 25a.

The epitaxially formed second counter doped layer 24b, and the material layer for providing the first source/drain region of the second conductivity type 30a of the second vertical semiconductor device 100b can each be doped using ion implantation or may be doped in situ. By "in-situ" it is meant that the dopant that dictates the conductivity type of the second counter doped layer 24b, and the material layer for providing the first source/drain region of the second conductivity type 30a of the second vertical semiconductor device 100b is introduced during the process step, e.g., epitaxial deposition, that forms the second counter doped layer 24b, and the material layer for providing the first source/drain region of the second conductivity type 30a. In some embodiments, the second vertical semiconductor device 100b is a p-type device, in which the first source/drain region of the second conductivity type 30a is doped to a p-type conductivity, and the second counter doped layer 24b is typically doped to an n-type conductivity.

The second counter doped layer 24b may have a thickness ranging from 5 nm to 50 nm. The thickness of the material layer for the first source/drain region of the second conductivity type 30a typically ranges from 10 nm to 100 nm.

Figure 5:
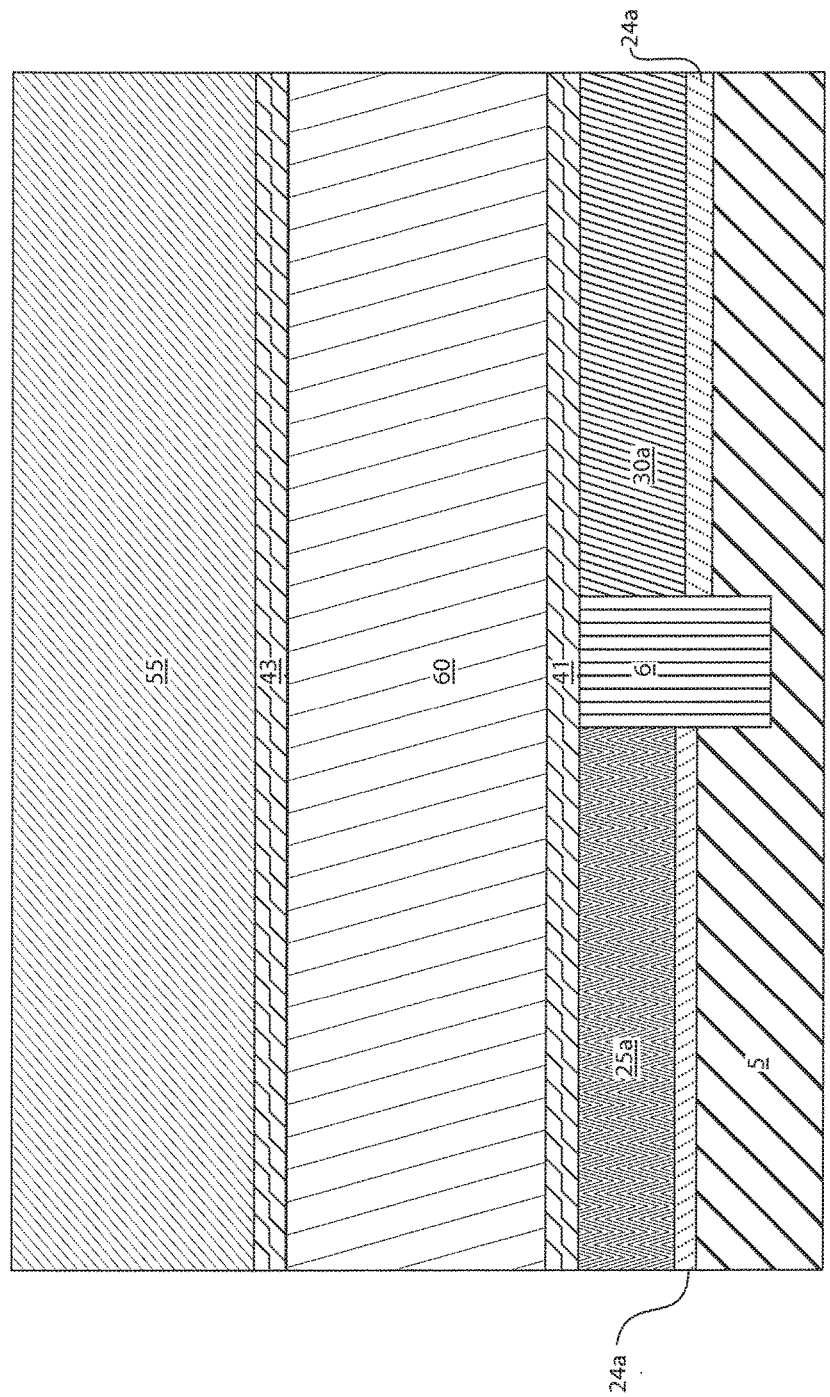
FIG. 5 is a side cross-sectional view depicting one embodiment of forming a material stack for producing a sacrificial gate structure on the structure depicted in FIG. 4.

FIG. 5 depicts one embodiment of forming a material stack for producing a sacrificial gate structure on the structure depicted in FIG. 4. In some embodiments, the material stack may include a first dielectric spacer layer that provides the first spacer 41 (also referred to as bottom spacer) of the first vertical semiconductor device 100a and the second vertical semiconductor device 100b, a sacrificial gate structure layer 60, a sacrificial spacer layer 43 and a cap dielectric layer 55. Each of the aforementioned layers may be formed atop the structure depicted in FIG. 5 using a deposition process, such as chemical vapor deposition (CVD), plasma enhanced chemical vapor deposition (PECVD), metal organic chemical vapor deposition (MOCVD), room temperature chemical vapor deposition (RTCVD), high density plasma chemical vapor deposition (HDPCVD) and combinations thereof.

The first dielectric spacer layer that provides the first spacer 41 may be composed of any dielectric material, and in some instances, may be composed of silicon oxide or silicon nitride. In some embodiments, the first spacer 41 can be composed of a low-k material. As used herein, the term "low-k" denotes a dielectric material having a dielectric constant equal to the dielectric constant of silicon oxide ($SiO_2$) or less. Examples of materials suitable for the low-k dielectric material include diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. The thickness of the first dielectric spacer layer may range from 5 nm to 20 nm.

The sacrificial gate structure layer 60 may be composed of any material that can be removed selectively to the first dielectric spacer layer. In some embodiments, the sacrificial gate structure layer 60 may be composed of a silicon containing material, such as amorphous silicon (α-Si). The sacrificial spacer layer 43 is similar to the first dielectric spacer layer. For example, the sacrificial spacer layer 43 may be composed of silicon oxide or silicon nitride. The cap dielectric layer 55 in some examples may be composed of an oxide, such as silicon oxide. The selection of the composition of the cap dielectric layer 55 and the sacrificial spacer layer 43 can be selected to provide that the cap dielectric layer 55 can be removed by an etch process that is selective to the sacrificial spacer layer 43. The sacrificial spacer layer 43 protects the sacrificial gate structure layer 60 from being etched by the process steps that remove the cap dielectric layer 55. The thickness of the cap dielectric layer 55 is selected to provide a portion of the fin structures for forming the upper source/drain region, i.e., second source/drain region 45a, 45b.

Figure 6:
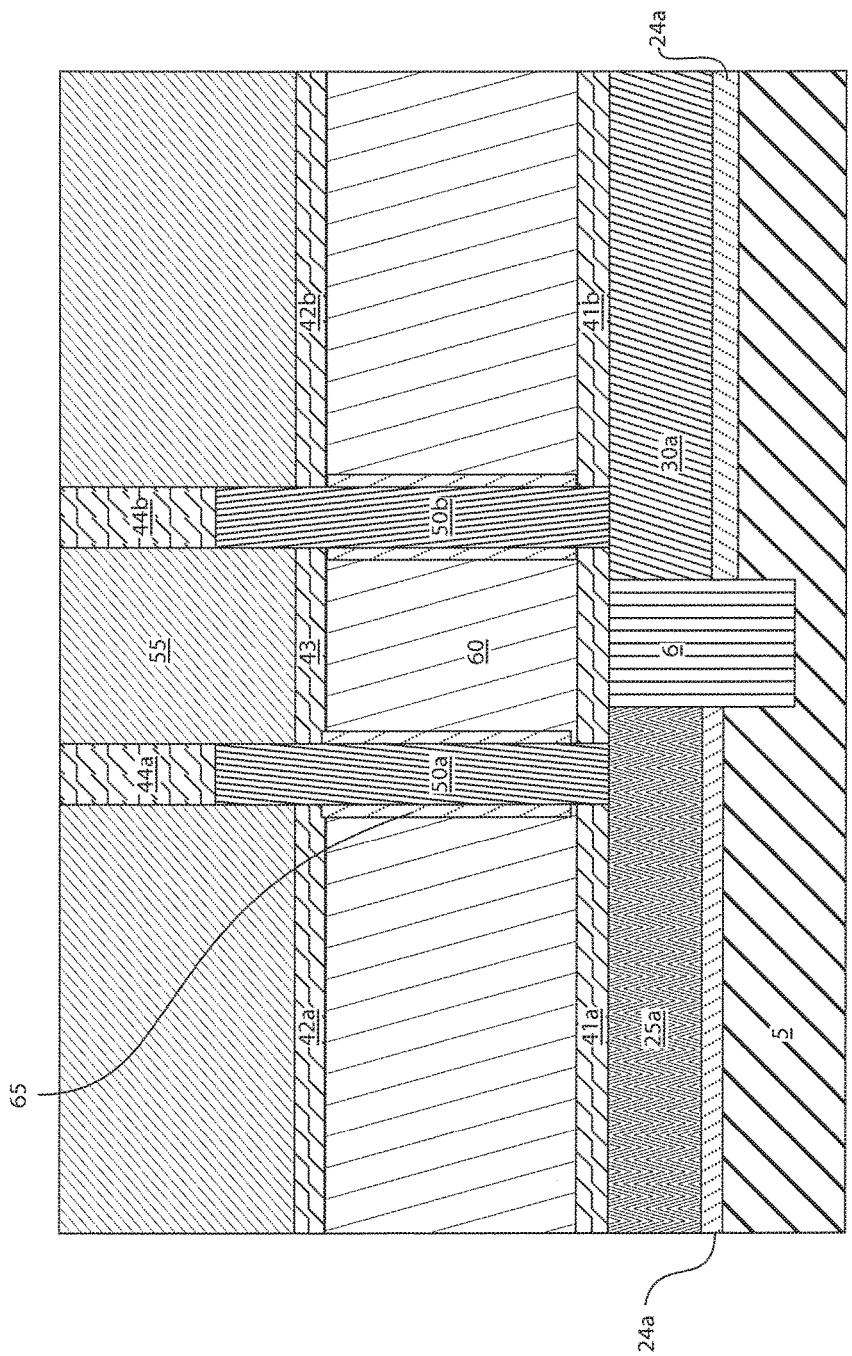
FIG. 6 is a side cross-sectional view of forming a first fin structure in a region of substrate including the first vertical semiconductor device, and forming a second fin structure in a region of the substrate including the second vertical semiconductor device, in accordance with one embodiment of the present disclosure.

FIG. 6 depicts forming fin structures 50a, 50b that provide the channel regions for the first and second vertical semiconductor devices 100a, 100b in the vertical field effect transistor (VFET) programmable complementary metal oxide semiconductor (CMOS) inverter 500. In some embodiments, forming the fin structures 50a, 50b may begin with forming fin structure openings through the material stack. The fin structure openings are formed using deposition, photolithography and etch processes. First, an etch mask is formed atop the material stack including the sacrificial gate layer 60 having openings exposing the portions of the material stack, in which the fin structure openings are formed. Specifically, an etch mask can be produced by applying a photoresist to the surface to be etched; exposing the photoresist to a pattern of radiation; and then developing the pattern into the photoresist utilizing conventional resist developer to produce the etch mask. Once the patterning of the photoresist is completed, the sections covered of the material stack covered by the etch mask are protected while the exposed regions are removed using an etching process that removes the unprotected regions. In some embodiments, the etch process may be an anisotropic etch that removes the exposed portions of the dielectric cap layer 55, the sacrificial spacer layer 43, as well as a portion of the first spacer layer 40 to expose a surface of the first source/drain region 20a, 20b. In some embodiments, the etch process for forming the fin structure openings may be selective to the material of the first source/drain regions 25a, 30a. For example, the etch process for forming the fin structure openings can be a reactive ion etch process.

Still referring to FIG. 6, following the formation of the fin structure openings, a thermal oxidation process forms a dielectric surface 65 of the sidewall surface of the sacrificial gate layer 60 that are exposed within the fin structure openings. In the embodiments in which the sacrificial gate layer 60 is composed of a silicon containing material, the dielectric surface 65 may be composed of an oxide, such as silicon oxide.

In a following process step, the fin structures 50, 50b are formed filling the fin structure openings using an epitaxial deposition process that employs the exposed surface of the first source/drain region 25a, 30a at the base of the fin structure openings as an epitaxial deposition growth surface. The epitaxial semiconductor material that provides the fin structures 50a, 50b does not form on dielectric surfaces, such as the dielectric cap layer 55 or the dielectric surface 65 of the sacrificial gate layer 60. The epitaxial growth process for forming the fin structures 50a, 50b is similar to the epitaxial growth process that is described above for forming the first source/rain region of the second conductivity type 30a and the second counter doped layer 24b. Therefore, the above description for epitaxially forming the first source/rain region of the second conductivity type 30a and the second counter doped layer 24b is suitable for describing at least one method of the epitaxial deposition processes used to form the fin structures 50a, 50b.

Similar to the first source/drain regions 25a, 30a, and the counter doped layers 24a, 24b, each of the fin structures 50a, 50b may be composed of a semiconductor material, e.g., a type IV semiconductor material, such as silicon or germanium, or a type III-V semiconductor material, such as gallium arsenic (GaAs). In some embodiments, the fin structure 50a for the first vertical semiconductor device 100a has the same composition as the fin structure 50b for the second vertical semiconductor device 100b. In some embodiments, the fin structure 50a for the first vertical semiconductor device 100a has a different composition than the fin structure 50b for the second vertical semiconductor device 100b.

The fin structures 50a, 50b may have a height ranging from 105 nm to 200 nm. In another embodiment, each of the fin structures 50a, 50b has a first height ranging from 10 nm to 100 nm. In one example, each of the fin structures 50a, 50b has a height ranging from 20 nm to 50 nm. Each of fin structures 50a, 50b may have a width ranging from 5 nm to 20 nm. In another embodiment, each of the fin structures 50a, 50b has a width ranging from 5 nm to 25 nm. In one example, each fin structure 50a, 50b has a width that is equal to 10 nm. The pitch separating adjacent fin structures 50a, 50b may range from 10 nm to 50 nm. In another embodiment, the pitch separating adjacent fin structures 50a, 50b may range from 20 nm to 40 nm. In one example, the pitch is equal to 30 nm.

FIG. 6 further depicts recessing the epitaxially formed fin structures 50a, 50b, and forming a dielectric cap 44 on the recessed surfaces of the fin structures 50a, 50b. The fin structures 50a, 50b may be recessed using an etch that is selective to the cap dielectric layer 55. Etching the epitaxially formed fin structures 50a, 50b forms a recess in the upper portions of the fin structure openings. The recess is filled with a deposited dielectric material to provide the dielectric cap 44. In some embodiments, the dielectric cap 44 may be composed of a nitride, such as silicon nitride, that is deposited using chemical vapor deposition (CVD), such as plasma enhanced chemical vapor deposition (PECVD).

Figure 7:
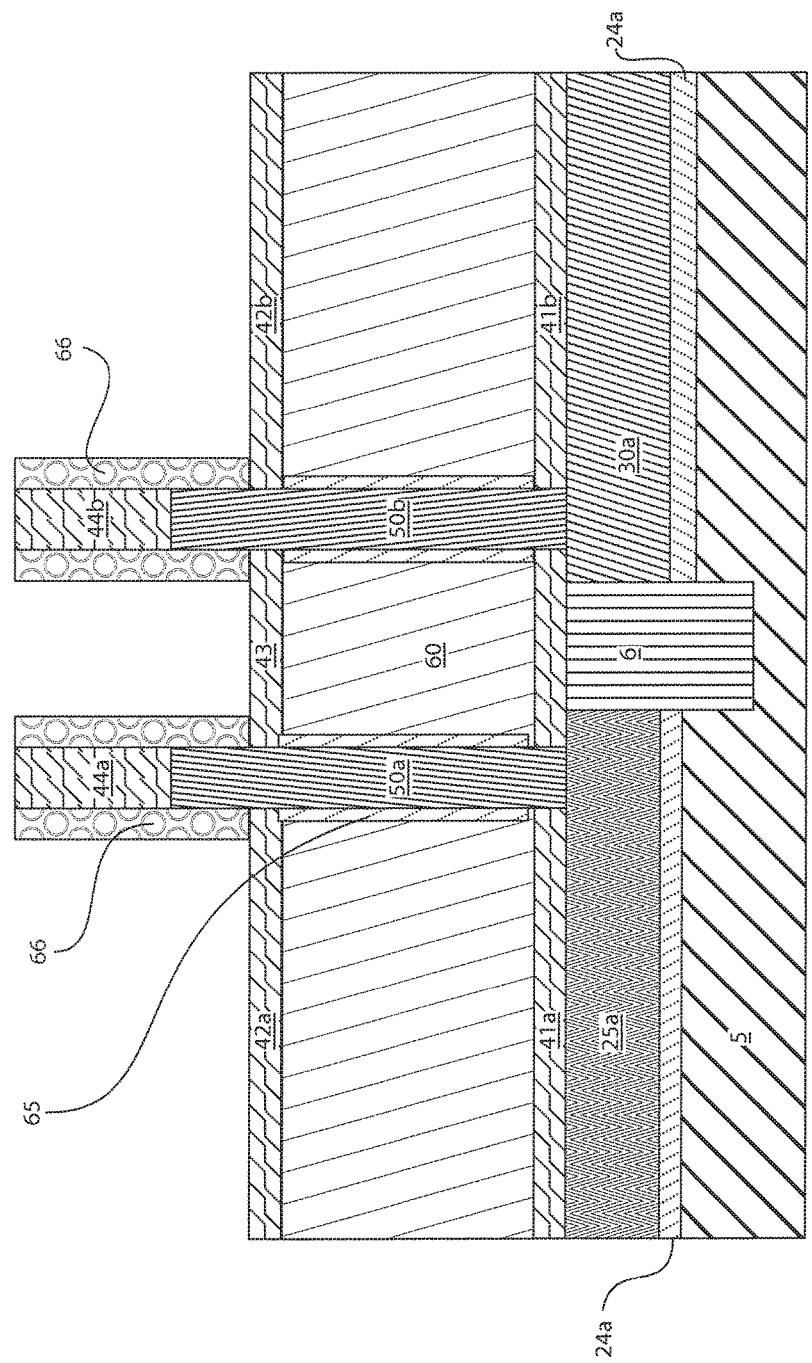
FIG. 7 is a side cross-sectional view of forming a spacer on exposed sidewalls of the first and second fin structures.

FIG. 7 depicts forming fin spacers 66 on portions of the fin structures 50a, 50b that are subsequently processed to include upper source/drain regions, i.e., second source/drain region of the first conductivity type 25b and second source/drain region of the second conductivity type 30b. In some embodiments, forming the fin spacers 66 may begin with removing the cap dielectric layer 55 with an etch process, such as an etch process that is selective to the sacrificial spacer layer 43. Removing the cap dielectric layer 55 exposes upper sidewalls of the fin structures 50a, 50b. The fin spacers 66 are formed on the exposed upper sidewalls of the fin structures 50a, 50b using a conformal deposition process, such as plasma enhanced chemical vapor deposition (PECVD), following by an anisotropic etchback process, such as reactive ion etch.

Figure 8:
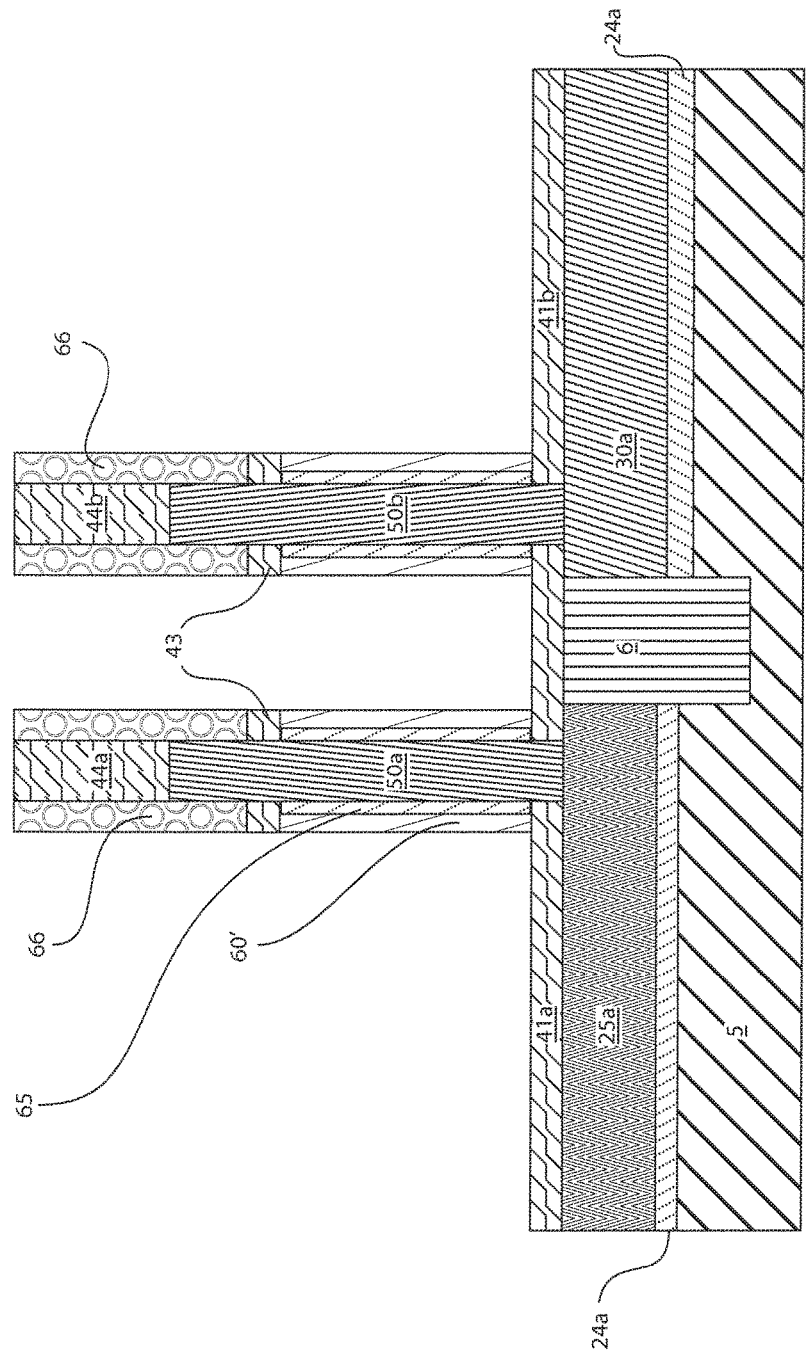
FIG. 8 is a side cross-sectional view of an etch process for forming a sacrificial gate structure to the first and second fin structures that are depicted in FIG. 5.

FIG. 8 depicts one embodiment of removing a majority of the material stack that includes the sacrificial gate layer 60. In some embodiments, an anisotropic etch, such as reactive ion etch (RIE), that is selective to the fin spacers 66, the dielectric fin cap 44 and the first dielectric spacer 41a, 41b removes a majority of the sacrificial spacer layer 43, and the sacrificial gate layer 60. Due to the anisotropic nature of the etch process, a remaining portion of the sacrificial spacer layer 43 and a remaining portion of the sacrificial gate layer 60' is present underlying the fin spacers 44.

Figure 9:
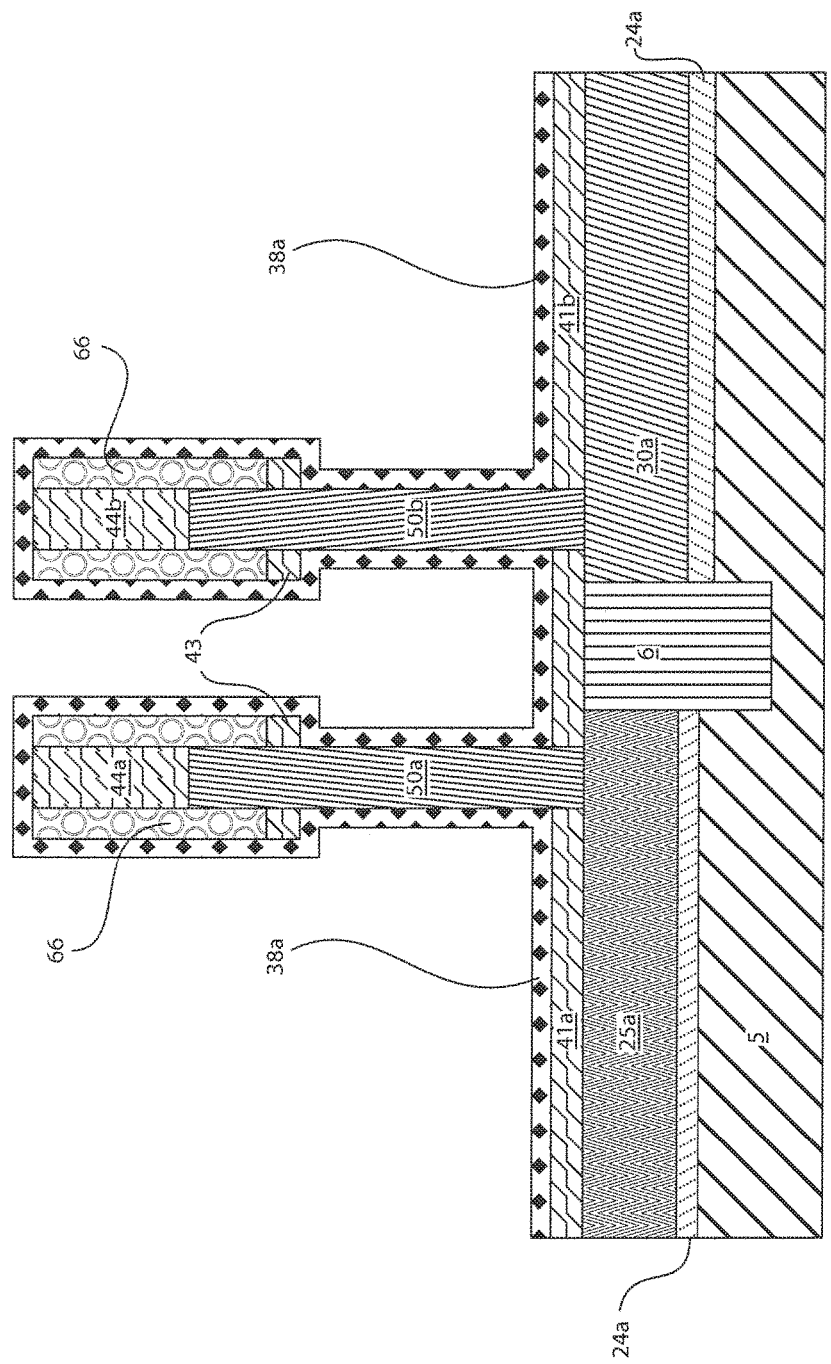
FIG. 9 is a side cross-sectional view of removing the sacrificial gate structure and forming a gate dielectric layer for the gate structure to the first vertical semiconductor device.

FIG. 9 depicts removing a remaining portion of the sacrificial gate structure and forming a gate dielectric layer 38a for the gate structure 35a first vertical semiconductor device 100a, which in the embodiment depicted in FIG. 2 is to an n-type conductivity device. The remaining portion of the sacrificial gate layer 60' that is present underlying the fin spacers 66 may be removed using an isotropic selective etch, such as a plasma etch, gas etch or wet etch process. The etch process may also remove the dielectric surface 65 of the sidewall surface of the sacrificial gate layer 60'. The etch process may be selective to the fin structures 50a, 50b. Following the isotropic etch, the sidewalls of the fin structures 50a, 50b that provide the channel regions of the first and second vertical semiconductor devices 100a, 100b may be exposed.

The gate dielectric 38a for the first gate structure 35a of the first vertical semiconductor device 100a may be blanket deposited as a conformal layer atop the entirety of the structure following removal of the remaining portions of the sacrificial gate layer 60' and the dielectric surface 65 that as formed on the fin structures 50a, 50b. The gate dielectric layer 38a may be deposited on both the first and second fin structures 50a, 50b at this stage of the process flow. The term "conformal" denotes a layer having a thickness that does not deviate from greater than or less than 30% of an average value for the thickness of the layer. In one embodiment, the first gate dielectric 38a may have a thickness ranging from 2 nm to 50 nm. In another embodiment, the gate dielectric 38a may have a thickness ranging from 5 nm to 20 nm. In the embodiment that is depicted in FIG. 9, the material layer that provides the first gate dielectric 38a is blanket deposited atop the entirety of the structure, and is therefore initially present on the exposed surfaces of the fin structures 50a, 50b, as well as the upper surfaces of the first dielectric spacer 41a, the fin spacers 66, and the dielectric fin cap 44.

In some embodiments, the first gate dielectric layer 38a may be composed of a high-k gate dielectric. As used herein, "high-k" denotes a dielectric material featuring a dielectric constant (k) higher than the dielectric constant of $SiO_2$ at room temperature. For example, the gate dielectric layer 38a may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the first gate dielectric layer 38a include hafnium silicate, hafnium silicon oxynitride or combinations thereof. The first gate dielectric layer 38a may be deposited using chemical vapor deposition methods, such as plasma enhanced chemical vapor deposition (PECVD). In other embodiments, the first gate dielectric layer 38a may be deposited using atomic layer deposition (ALD).

Figure 10:
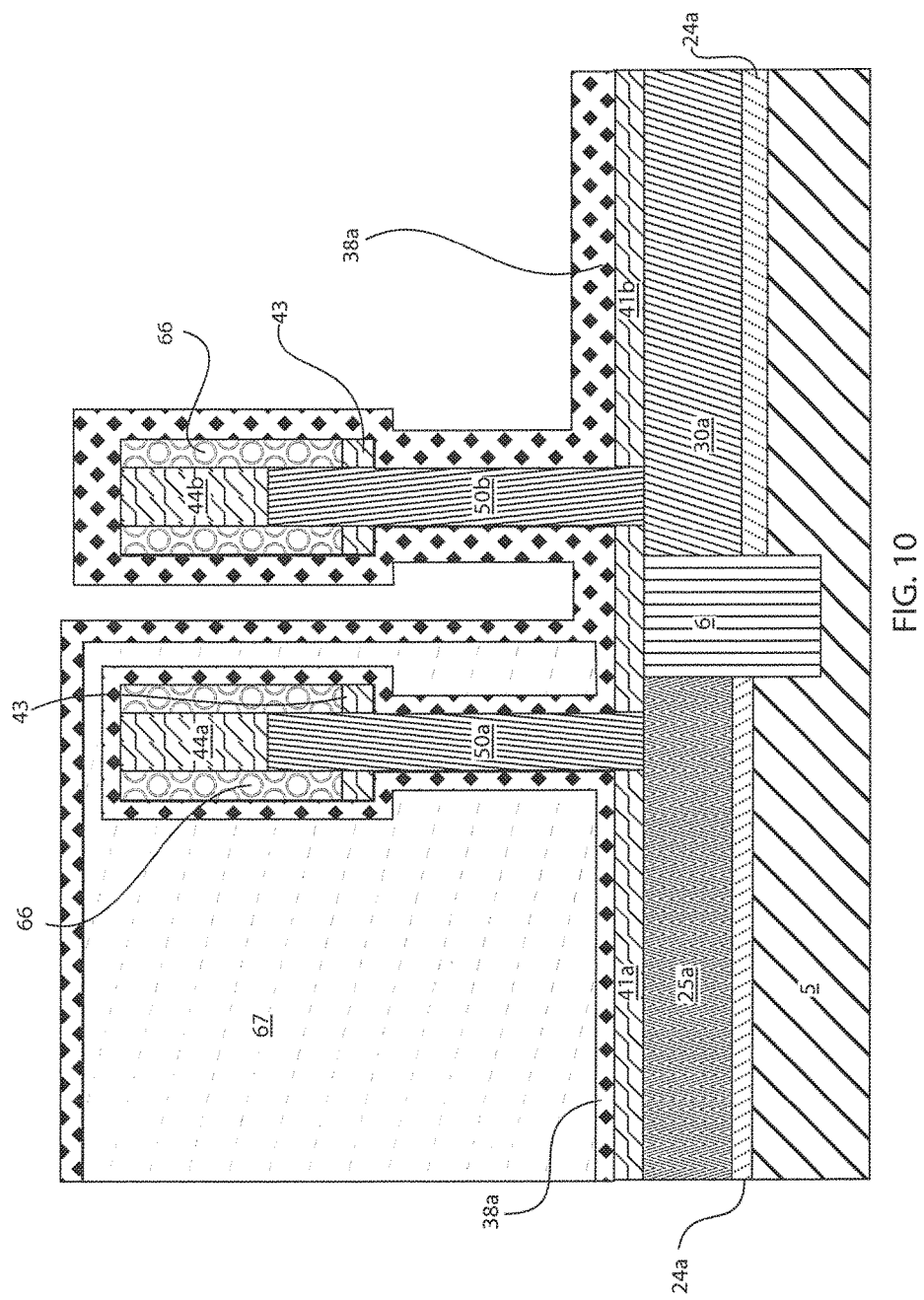
FIG. 10 is a side cross-sectional view of forming a thick dielectric layer for the floating gate structure to the second vertical semiconductor device.

FIG. 10 depicts one embodiment of forming a thick dielectric layer, i.e., second gate dielectric layer 38b, for the floating gate structure, i.e., second gate structure 35b, to the p-type conductivity type device, i.e., second vertical semiconductor device 100b. In some embodiments, forming the second gate dielectric layer 38b may include forming a block mask 67 covering the region of the substrate 5 in which the first vertical semiconductor device 100a is to be positioned. The block mask 67 may be composed of a photoresist that is patterned using photolithography and developed using a chemical developer. The block mask 67 leaves the region of the substrate 5 in which the second vertical semiconductor device 100b is to be positioned. Thereafter, the second gate dielectric layer 38b may be deposited over the exposed portion of the substrate including the second fin structure 50b for the second vertical semiconductor device 100b. In one example, the second gate dielectric layer 38b may be deposited on the block mask 67 that is present over the portion of the substrate 5 that the first vertical semiconductor device 100a positioned, and is deposited on the portion of the first gate dielectric layer 38a that is present on the fin structure 50b that provides the channel of the second vertical semiconductor device 100b.

The second gate dielectric layer 38b has a thickness greater than the first gate dielectric layer 38a. The thickness of the second gate dielectric layer 38b is selected to provide that the second gate structure 35b to the second vertical semiconductor device 100b, e.g., a p-type vertical semiconductor device, is a floating gate structure that can be a programmable gate structure that provides the programmable aspect of the programmable vertical transistor field effect transistor complementary metal oxide semiconductor inverter 500.

The second gate dielectric layer 38b has a conformal thickness. In some embodiments, the thickness of the second gate dielectric layer 38b has a thickness ranging from 2 nm to 200 nm. In another embodiment, the thickness of the second gate dielectric layer 38b has a thickness ranging from 2 nm to 20 nm.

In some embodiments, the second gate dielectric layer 38b may be composed of a high-k gate dielectric. For example, the gate dielectric layer 38b may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the second gate dielectric layer 38b include hafnium silicate, hafnium silicon oxynitride or combinations thereof. The second gate dielectric layer 38b may be deposited using chemical vapor deposition methods, such as plasma enhanced chemical vapor deposition (PECVD), or atomic layer deposition (ALD).

In some embodiments, following the formation of the second gate dielectric layer 38b, a work function adjusting metal layer, such as an n-type or p-type work function metal layer may be deposited. In the embodiment depicted in FIG. 2, the second vertical semiconductor device 100b is a p-type semiconductor device, and the work function adjusting metal layer is a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. In one embodiment, the p-type work function metal layer is composed of titanium nitride (TiN). The p-type work function metal layer may also be composed of TiAlN, Ru, Pt, Mo, Co and alloys and combinations thereof. The work function adjusting layer can be deposited using chemical vapor deposition (CVD), physical vapor deposition (PVD) and/or atomic layer deposition (ALD).

In some embodiments, following formation of the second gate dielectric 38b, the block mask 67 may be removed. In some embodiments, removing the block mask may include depositing an interlevel dielectric (ILD) layer, following by a chemical mechanical planarization step to provide a coplanar upper surface between the regions of the substrate for the first vertical semiconductor device 100a and the second vertical semiconductor device 100b. Thereafter, the interlevel dielectric layer and the block mask 67 may be removed using selective etching.

Figure 11:
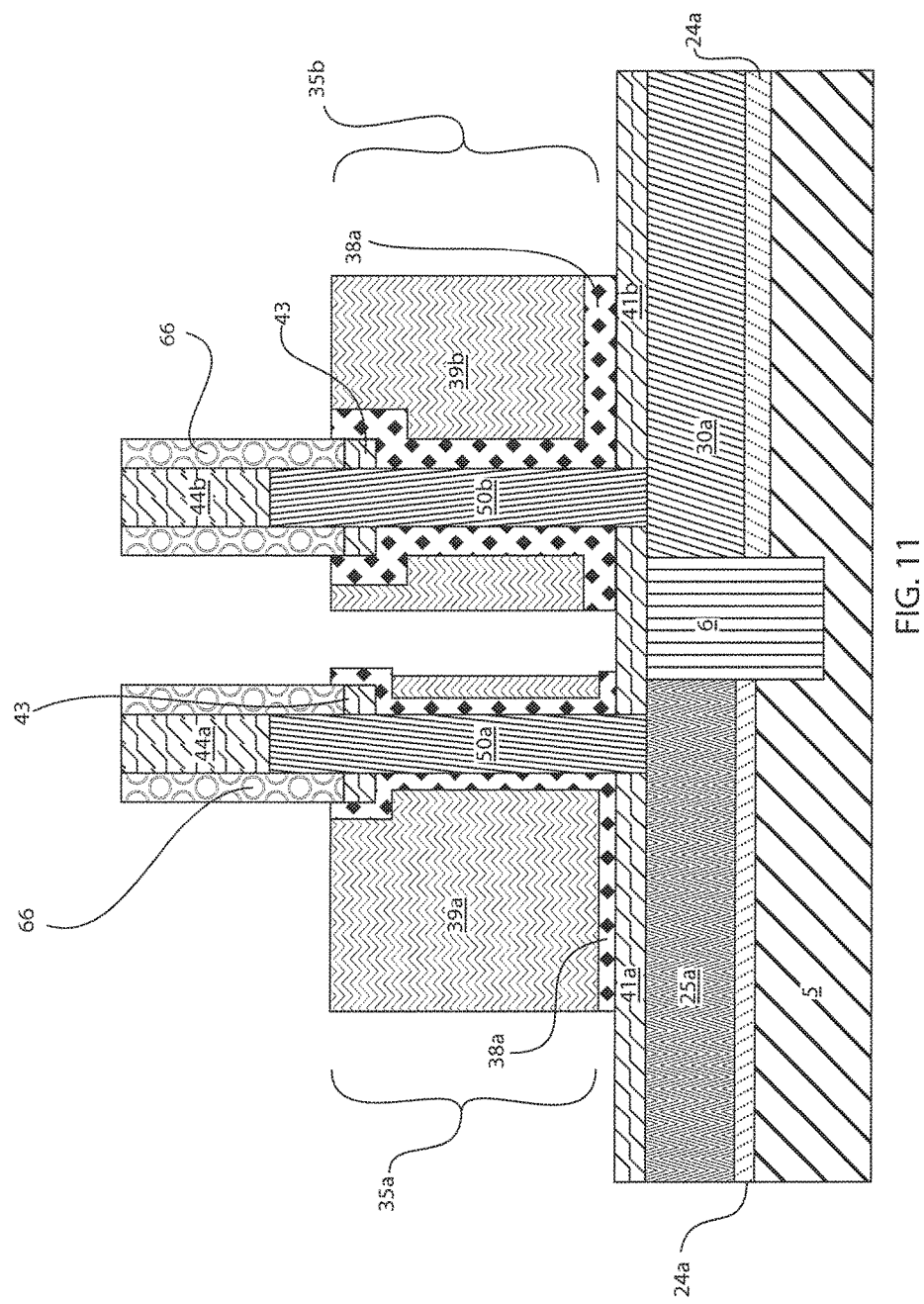
FIG. 11 is a side cross-sectional view depicting forming gate conductors to the channel regions within the fin structures for the vertical field effect transistors.

FIG. 11 depicts forming a first gate conductors 39a to the channel region within the first fin structure 50a of the first vertical semiconductor device 100a, and forming a second gate conductor 39b to the channel region within the second fin structure 50b of the second vertical field effect transistors 100b. The first and second gate conductors 39a, 39b may be formed using deposition, patterning and etch processes. The first and second gate conductors 39a, 39b may be composed of one or more electrically conductive materials, such as metals and electrically conductive semiconductors.

In some embodiments, if work function adjusting metals were not previously formed, p-type and n-type work function adjusting metals may be formed as a component of the first and second gate conductors 39a, 39b. In some embodiments, the first gate conductor 39a is part of an n-type vertical semiconductor device 100a, and the second gate structure 39b is part of a p-type vertical semiconductor device 100b. In one embodiment, a p-type work function metal layer for the second gate conductor 39b may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. In one embodiment, the n-type work function metal layer for the first gate conductor 39a can be composed of at least one of TiAl, TaN, TiN, HfN, HfSi, or combinations thereof. In addition to the above described work function metals, the first and second gate conductors 39a, 39b may be composed of a metal selected from tungsten (W), tungsten nitride (WN) or combinations thereof. In one or more embodiments, the first and second gate conductors 39a, 39b may be composed of tungsten (W). In another embodiment, the first and second gate conductors 39a, 39b may be doped semiconductor material, such as n-type doped polysilicon.

The material layer for the first and second gate conductors 39a, 39b may be deposited by CVD, e.g., plasma enhanced chemical vapor deposition (PECVD). In other examples, the material layer for the first and second gate conductors 39a, 39b may be deposited using physical vapor deposition, such as sputtering. In yet further examples, the material layer for the first and second gate conductors 39a, 39b may be deposited using plating, electroplating, electroless deposition, and combinations thereof.

Following deposition of the material layer for the first and second gate conductors 39a, 39b, an etch process, such as reactive ion etch (RIE), may recess the material layer to the appropriate height. In a following process step, an etch mask may be formed on the recessed material layer for the first and second gate conductors 39a, 39b having a pattern selected to provide the separate geometries for each of the first gate conductor 39a of the first gate structure 35a to the first vertical semiconductor device 100a, and for the second gate conductor 39b of the second gate structure 35b to the second semiconductor device 100b. The etch mask may be a photoresist mask. Following formation of the etch mask for defining the geometry of the first and second gate conductors 39a, 39b, the material layer for the first and second gate conductors 39a, 39b may be etched to remove the exposed portions. Following the etch process, the etch mask may be removed. In a following process step, the exposed portions of the first and second gate dielectric layers 38a, 38b may be removed using an etch that is selective to the first and second gate conductors 39a, 39b, or alternatively by an etch that is selective to the photoresist mask that is used to define the gate conductors 39a, 39b.

Figure 12:
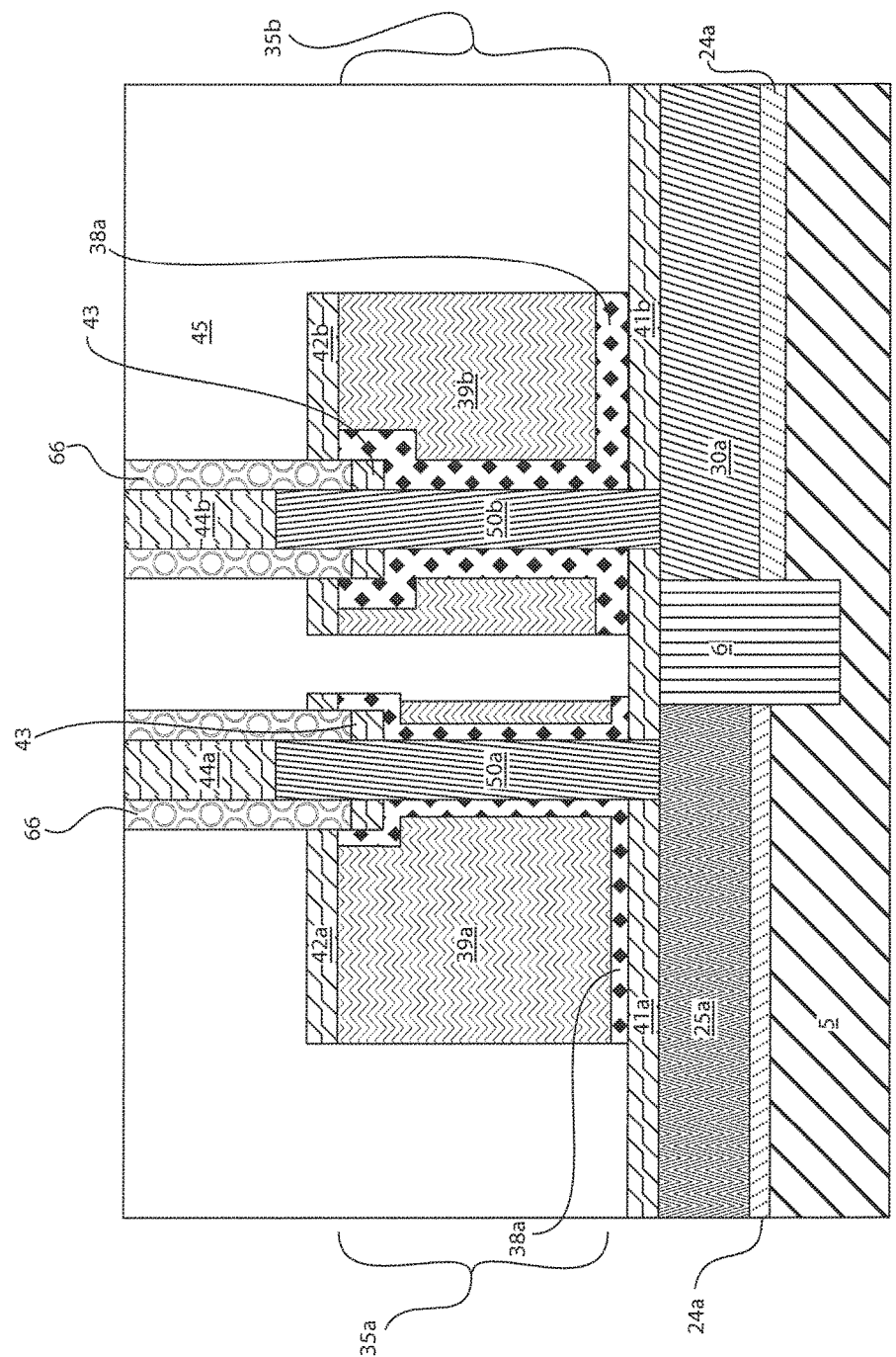
FIG. 12 is side cross-sectional view depicting forming a spacer on the upper surfaces of the gate structures to the vertical field effect transistors and forming an interlevel dielectric layer.

FIG. 12 depicts forming an interlevel dielectric layer 45 on the structure depicted in FIG. 11. Prior to forming the interlevel dielectric layer 45, a second dielectric spacer 42a, 42b (which may be referred to as the top spacer) is formed atop the gate conductor 39a, 39b. The second dielectric spacer 42a, 42b is similar to the first dielectric spacer 41a, 41b that is described above. Therefore, the description of the composition for the first dielectric spacer 41a, 41b is suitable for describing at least one embodiment of the composition for the second dielectric spacer 42a, 42b. The second dielectric spacer 42a, 42b may be formed using deposition, photolithography and etching processes, and the process sequence for forming the second dielectric spacer 42a, 42b may be integrated into the process sequence for patterning the gate conductors 39a, 39b.

Still referring to FIG. 12, the interlevel dielectric layer 45 may be composed of any dielectric material, such as an oxide, nitride or oyxnitride material. For example, the interlevel dielectric layer 45 may be composed of any dielectric material used in microelectronic and nanoelectronic structures, which can include $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H). The interlevel dielectric layer 45 may be deposited using chemical vapor deposition, deposition from solution, spin on deposition and combinations thereof. Following deposition, a planarization process may be applied to the upper surface of the interlevel dielectric layer 45.

Figure 13:
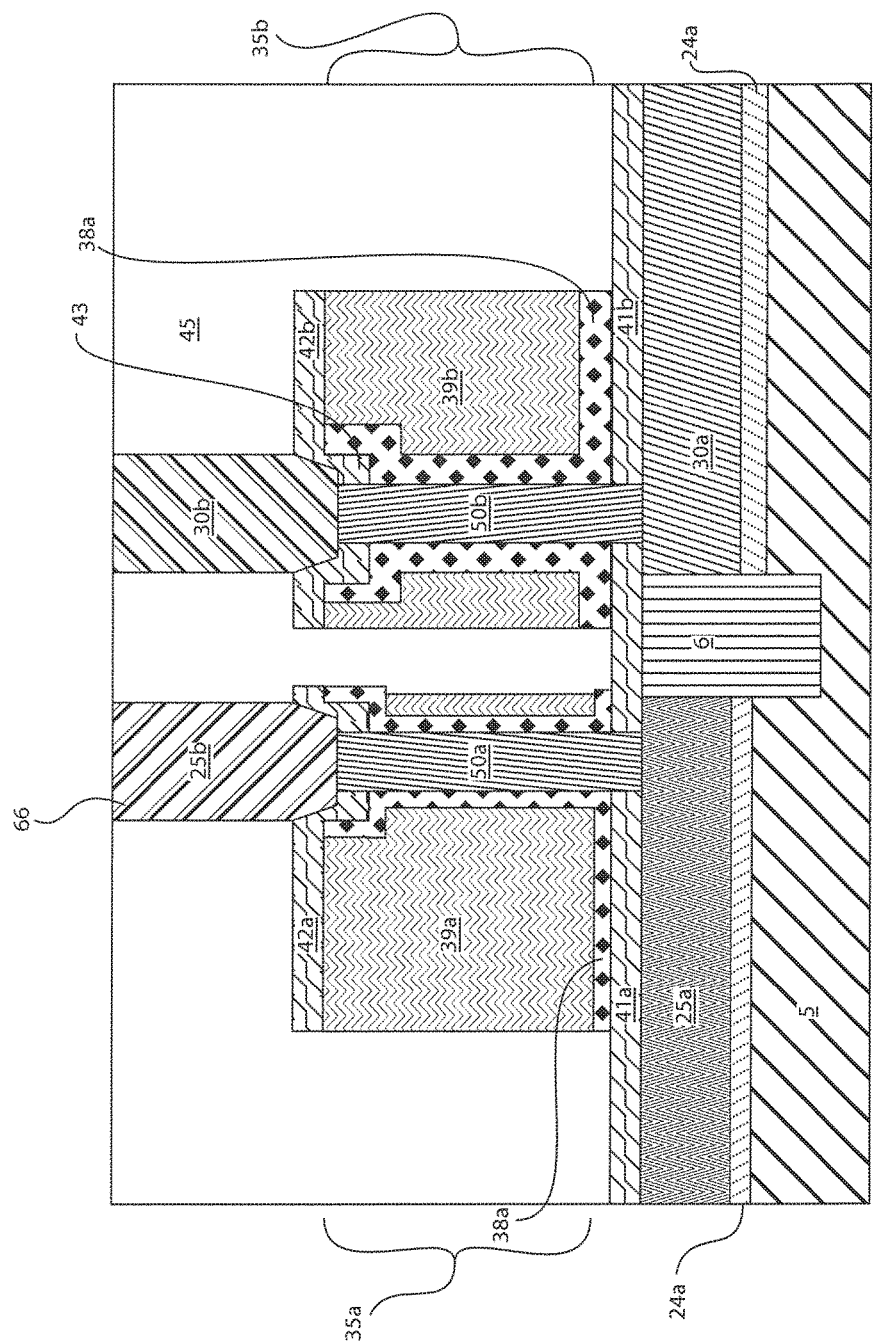
FIG. 13 is a side cross-sectional view depicting forming epitaxial semiconductor material for the upper source and drain regions on the upper surfaces of the fin structures for the first and second vertical devices, in accordance with one embodiment of the present disclosure.

FIG. 13 depicts forming epitaxial semiconductor material for the upper source and drain regions 25b, 30b on the upper surfaces of the fin structures 50a, 50b for the first and second vertical devices 100a, 100b. The upper source/drain region 25b for the first vertical semiconductor device 100a is also referred to as the second source/drain region of the first conductivity type 25b, which may be an n-type conductivity. The upper source/drain region 30b for the second vertical semiconductor device 100b is also referred to as the second source/drain region of the second conductivity type, which may be a p-type conductivity.

The upper source/drain regions 25b, 30b may be formed using an epitaxial deposition process. The process flow for forming each of the upper source/drain regions 25b, 30b may employ block masks to individually process the upper source/drain regions for each of the first and second vertical semiconductor devices 100a, 100b. The block masks may be photoresist masks, but in some embodiments, the block masks may be hard masks, e.g., hard masks composed of silicon nitride or silicon oxide. For example, a first block mask may be formed over the region of the substrate 5 in which the first fin structure 50a to the first vertical semiconductor device 100a is positioned, and a selective etch process may be used to remove the dielectric fin cap 44 and the fin spacers 66 that are present on the second fin structure 50b. The etch process for removing the exposed dielectric fin cap 44 and the fin spacers 66 may be a wet or dry etch, e.g., reactive ion etch, that can be selective to the second fin structure 50b, as well as the interlevel dielectric layer 45. Following removal of the dielectric fin cap 44 and the fin spacer 66 in the region of the substrate 5 in which the second fin structure 50b is present, a second source/drain region of a second conductivity type 30b may be formed on the exposed end of the second fin structure 50b, and may be doped to a p-type conductivity.

The first block mask may then be removed, and a second block mask may be formed over the second fin structure 50b protecting the second source/drain region of the second conductivity type 30b, while leaving the first fin structure 50a exposed. A selective etch can then be used to remove the dielectric fin cap 44 and the fin spacer 66 from the first fin structure 50a, while the second source/drain region of the second conductivity type 30b is protected by the second block mask. A second source/drain region of the first conductivity type 25b may then be formed on the exposed fin structure 50a. The second source/drain region of the first conductivity type 25b may be epitaxially formed on the exposed surface of the fin structure 50a, and may be doped to an n-type conductivity. The second block mask may then be removed. It is noted that planarization steps, such as chemical mechanical planarization (CMP) may be applied to the upper surface of each of the second source/drain regions 25b, 30b after they are formed.

Each of the second source/drain regions 25b, 30b may be formed using an epitaxial growth processes. The above description of the compositions for the first/source drain regions 25a, 30a, as well as their epitaxial growth process, are suitable for describing at least one embodiment of the composition and dopant type for the second source/drain regions 25b, 30b. For example, the second source/drain regions 25b, 30b may be composed of type IV semiconductor material, such as silicon (Si), or a type III-V semiconductor material, such as gallium arsenide (GaAs). Further, the second source/drain regions 25b, 30b may be in-situ doped to provide their conductivity type, doped using ion implantation, or doped using a combination of ion implantation and in situ doping.

Figure 14:
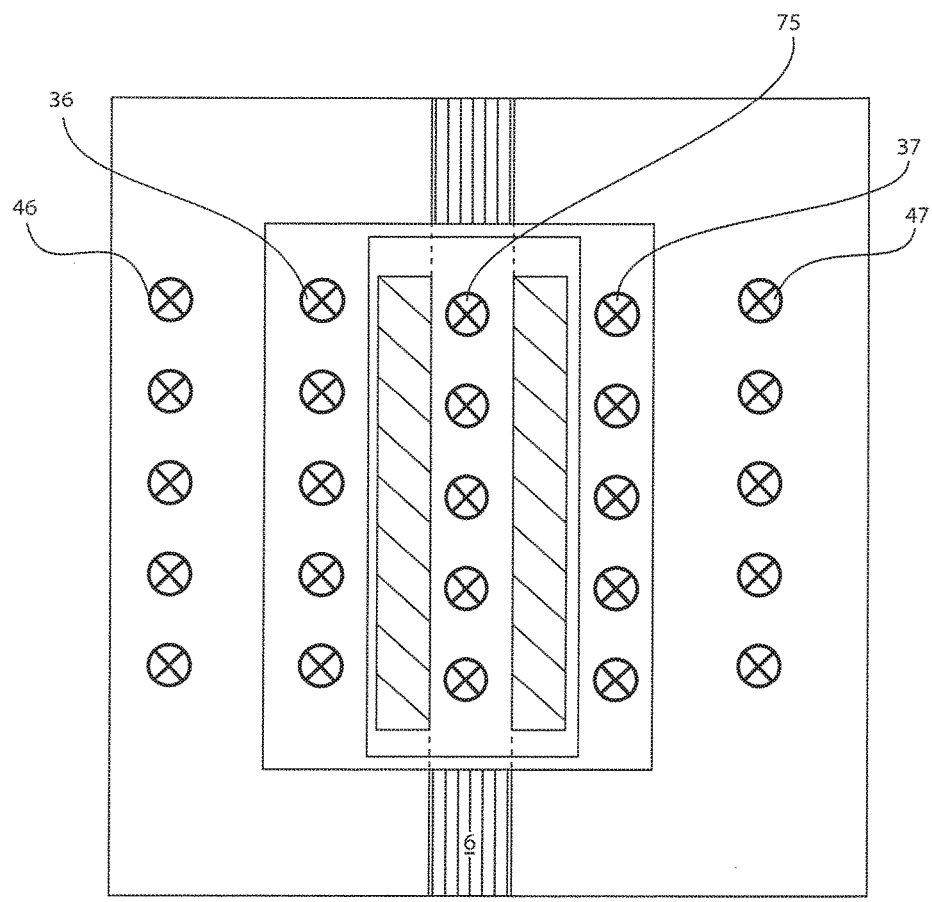
FIG. 14 is a top down view depicting forming contacts to the vertical field effect transistor (VFET) programmable complementary metal oxide semiconductor (CMOS) inverter.

Referring to FIGS. 2 and 14, following formation of the second source/drain regions 25b, 30b, a common contact 75, floating gate (FG) contact 37, input contact 36, positive supply voltage (VDD) contact 47, and a negative supply contact (VSS) 46 is formed to the vertical field effect transistor (VFET) programmable complementary metal oxide semiconductor (CMOS) inverter 500. The common contact 75 is a single contact that provides for electrically communication to the second source/drain region having the first conductivity type 25b of the first vertical semiconductor device 100a, and to second source/drain region having the second conductivity type 30b of the second vertical semiconductor device 100b.

The common contact 75, floating gate (FG) contact 37, input contact 36, positive supply voltage (VDD) contact 47, and a negative supply contact (VSS) 46 may each be produce by forming an opening through the interlevel dielectric layer 45; and filling the via opening with an electrically conductive material. The via opening may be formed using photolithography and etch processes. For example, a photoresist mask may be formed exposing the portion of the dielectric material layers in which the via opening is to be formed, wherein following formation of the photoresist mask, the via opening may be etched into the interlevel dielectric using an etch process, such as reactive ion etch. The via opening may be filled with a doped semiconductor material, such as n-type doped polysilicon, or a metal, such as copper, aluminum, titanium, tungsten, platinum or combinations thereof, to form the common contact 75, floating gate (FG) contact 37, input contact 36, positive supply voltage (VDD) contact 47, and a negative supply contact (VSS) 46. The electrically conductive material may be deposited into the via opening using physical vapor deposition (PVD). Examples of PVD processes suitable for depositing the metal for the via contacts 34a, 34b, 35 include plating, electroplating, electroless plating, sputtering and combinations thereof.

Having described preferred embodiments of a structure and method for forming A Vertical Field Effect Transistor (Vfet) Programmable Complementary Metal Oxide Semiconductor Inverter, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:
1. A semiconductor inverter comprising:
a first vertical semiconductor device including a first channel region present in a first fin structure having source and drain regions of a first conductivity type;
a second vertical semiconductor device including a second channel region present in a second fin structure having source and drain regions of a second conductivity type; and
a common contact electrically connecting an upper source and drain region of the first conductivity type for the first vertical semiconductor device to an upper source and drain region of the second conductivity type for the second vertical semiconductor device, the common electrical contact providing an output for the inverter, the common contact provided by a metal fill formed in a trench, a first end of metal fill contacting the upper source and drain region for the first vertical semiconductor device, and a second end of the metal fill contacting the upper source and drain region of the second vertical semiconductor device.

2. The semiconductor inverter of claim 1, wherein the first vertical semiconductor device is in a first region of a supporting substrate, and the second vertical semiconductor device is present in a second region of the supporting substrate.

3. The semiconductor inverter of claim 2, wherein the first region of the supporting substrate is separated from a second region of the supporting substrate by an isolation region.

4. The semiconductor inverter of claim 1, wherein a negative supply voltage (VSS) connection is in electrical communication with one of source and drain regions of the first conductivity type or source and drain regions of the second conductivity type that is not directly contacted by the common contact.

5. The semiconductor inverter of claim 3, wherein the first vertical semiconductor device includes a first source and drain region of a first conductivity type on the supporting substrate, the first fin structure atop the first source and drain region having the first conductivity type, and a second source and drain region of a first conductivity type comprised of epitaxial semiconductor material present on an end of the first fin structure that is opposite and end of the first fin structure directly contacting the first source and drain region having the first conductivity type.

6. The semiconductor inverter of claim 5, wherein the first conductivity type is n-type.

7. The semiconductor inverter of claim 1, wherein a positive supply voltage (VDD) connection is in electrical communication with one of the first conductivity type source and drain regions or the second conductivity type source and drain regions that is not directly contacted by the common contact.

8. The semiconductor inverter of claim 3, wherein the second vertical semiconductor device includes a first source and drain region of a second conductivity type on the supporting substrate, the second fin structure atop the first source and drain region having the second conductivity type, and a second source and drain region of a second conductivity type comprised of epitaxial semiconductor material present on an end of the second fin structure that is opposite an end of the second fin structure directly contacting the first source and drain region having the second conductivity type.

9. The semiconductor inverter of claim 1, wherein the first fin structure and the second fin structure are separated by a pitch ranging from 25 nm to 40 nm.

10. A semiconductor inverter comprising:
a first vertical semiconductor device having source and drain regions of a first conductivity type;
a second vertical semiconductor device having source and drain regions of a second conductivity type; and
a common contact electrically connecting an upper source and drain region of the first conductivity type for the first vertical semiconductor device to an upper source and drain region of the second conductivity type for the second vertical semiconductor device, the common electrical contact providing an output for the inverter, the common contact provided by a metal, a first end of the metal contacting the upper source and drain region for the first vertical semiconductor device, and a second end of the metal contacting the upper source and drain region of the second vertical semiconductor device.

11. A method of forming a semiconductor inverter comprising:
forming a first conductivity type vertically orientated semiconductor device in a first region of a substrate;
forming a second conductivity type vertically orientated semiconductor device in a second region of the substrate; and
forming a common contact electrically connecting an upper source and drain region for the first conductivity type vertically orientated semiconductor device to an upper source and drain region of the second conductivity type vertically orientated semiconductor device, the common electrical contact providing an output for the inverter, the common contact provided by a metal, a first end of metal contacting the upper source and drain region for the first vertical semiconductor device, and a second end of the metal contacting the upper source and drain region of the second vertical semiconductor device.

12. The method of claim 11, wherein a first channel for the first conductivity type vertically orientated semiconductor device is present within a first fin structure.

13. The method of claim 12, wherein the first fin structure is epitaxially formed.

14. The method of claim 12, wherein a second channel for the second conductivity type vertically orientated semiconductor device is present in a second fin structure.

15. The method of claim 14, wherein the second fin structure is epitaxially formed.

16. The method of claim 14, wherein the first fin structure and the second fin structure are separated by a pitch ranging from 25 nm to 40 nm.

17. The method of claim 16, wherein the second gate structure that provides the floating gate includes a gate dielectric having a greater thickness than the gate dielectric in the first gate structure.

18. The method of claim 15, wherein the upper source and drain region for the first conductivity type vertically orientated semiconductor device, and the upper source and drain region of the second conductivity type vertically orientated semiconductor device are epitaxially formed.

19. The method of claim 15, wherein a negative supply voltage (VSS) connection is formed in electrical communication with one of source and drain regions of one of said first and second conductivity type vertically orientated semiconductor device.

20. The method of claim 15, wherein a positive supply voltage (VDD) connection is formed in electrical communication with one of source and drain regions of one of said first and second conductivity type vertically orientated semiconductor device.

* * * * *